(12) United States Patent
Kwon et al.

(10) Patent No.: US 8,120,045 B2
(45) Date of Patent: Feb. 21, 2012

(54) METAL-BASED PHOTONIC DEVICE PACKAGE MODULE

(75) Inventors: Young-Se Kwon, Daejeon (KR); Kyoung-Min Kim, Seoul (KR); Sung-Woo Hyun, Seoul (KR); Bo-In Son, Gumi-Si (KR)

(73) Assignees: Wavenics Inc., Daejeon (KR); Korea Advanced Institute of Science and Technology, Daejeon (KR)

( * ) Notice: Subject to any disclaimer, the term of this patent is extended or adjusted under 35 U.S.C. 154(b) by 71 days.

(21) Appl. No.: 12/596,888

(22) PCT Filed: Sep. 18, 2007

(86) PCT No.: PCT/KR2007/004489
§ 371 (c)(1),
(2), (4) Date: Oct. 21, 2009

(87) PCT Pub. No.: WO2009/001982
PCT Pub. Date: Dec. 31, 2008

(65) Prior Publication Data
US 2010/0133557 A1 Jun. 3, 2010

(30) Foreign Application Priority Data
Jun. 22, 2007 (KR) .......................... 10-2007-0061589
Jul. 13, 2007 (KR) .......................... 10-2007-0070817

(51) Int. Cl.
*H01L 29/18* (2006.01)
(52) U.S. Cl. ................. 257/88; 257/81; 257/98; 257/99; 257/E33.056; 257/E33.068; 257/E33.072

(58) Field of Classification Search .................... 257/81, 257/88, 98, 99, E33.056, E33.068, E33.072
See application file for complete search history.

(56) References Cited

U.S. PATENT DOCUMENTS

| 7,262,440 B2 * | 8/2007 | Choi et al. ...................... 257/99 |
| 7,268,014 B2 * | 9/2007 | Lee et al. ....................... 438/106 |
| 7,473,654 B2 * | 1/2009 | Hashi ............................. 438/785 |
| 2005/0280019 A1 | 12/2005 | Konno | |
| 2007/0029567 A1 * | 2/2007 | Mori et al. ...................... 257/98 |

FOREIGN PATENT DOCUMENTS

| JP | 2003218398 A | 7/2003 |
| JP | 2007158086 A | 6/2007 |

OTHER PUBLICATIONS

International Search Report and the Written Opinion of the International Searching Authority mailed Jul. 20, 2009. PCT/KR2007/004489.

* cited by examiner

*Primary Examiner* — Andy Huynh
(74) *Attorney, Agent, or Firm* — Gifford, Krass, Sprinkle, Anderson & Citkowski, P.C.

(57) ABSTRACT

A metal-based photonic device package module that is capable of greatly improving heat releasing efficiency and implementing a thin package is provided. The metal-based photonic device package module includes a metal substrate that is formed the shape of a plate, a metal oxide layer that is formed on the metal substrate to have a mounting cavity, a photonic device that is mounted in the mounting cavity of the metal oxide layer, and a reflecting plane that is formed at an inner surface of the mounting cavity of the metal oxide layer.

17 Claims, 7 Drawing Sheets

METAL-BASED PHOTONIC DEVICE PACKAGE MODULE

CROSS-REFERENCE TO RELATED APPLICATIONS

This application is the U.S. national phase of PCT/KR2007/004489 filed Sep. 18, 2007, which claims priority of Korean Patent Application Nos. 10-2007-0061589 filed Jun. 22, 2007 and 10-2007-0070817 filed Jul. 13, 2007.

TECHNICAL FIELD

The present invention relates to a metal-based photonic device package module and a manufacturing method thereof, and more particularly, to a metal-based photonic device package module and a manufacturing method thereof that is capable of effectively releasing heat generated from a photonic device and implementing a slim product thereof in various shapes.

BACKGROUND ART

Recently, photonic devices such as a light emitting diode (LED) have been widely used as next-generation illuminating source in various applications. However, since the LED and the like is vulnerable to heat, efficiency thereof is decreased, and lifecycle is shortened. In addition, different changes in wavelengths of red (R), green (G), and blue (B) light occur according to an increase in temperature. Moreover, since the LED and the like tend to be used for high power products, the problem caused by the heat becomes more serious.

Therefore, a structure for efficiently releasing the heat from the LED and the like is an important part of a packaging process.

The above information disclosed in this Background section is only for enhancement of understanding of the background of the invention and therefore it may contain information that does not form the prior art that is already known in this country to a person of ordinary skill in the art.

DISCLOSURE OF INVENTION

Technical Problem

The present invention has been made in an effort to provide a metal-based photonic device package module and a manufacturing method thereof having advantages of being capable of greatly improving heat releasing efficiency and implementing a thin package by using a metal substrate, and that is capable of substantially reducing the possibility of occurrence of a short-circuit to a bottom electrode by forming an metal oxide layer.

Technical Solution

An exemplary embodiment of the present invention provides a metal-based photonic device package module including a metal substrate that is formed in the shape of a plate, a metal oxide layer that is formed on the metal substrate to have a mounting cavity, a photonic device that is mounted in the mounting cavity of the metal oxide layer, and a reflecting plane that is formed at an inner surface of the mounting cavity of the metal oxide layer.

In the above embodiment, the photonic device may be electrically connected to the passive circuit and a connection wire line by using a wire electrode or a reflecting plane made of a conductive material.

The metal oxide layer may be formed to have a mounting cavity by performing selective anodic oxidation on the metal substrate. In addition, the metal oxide layer may be formed to have a mounting cavity by performing anodic oxidation on the entire surface of the metal substrate and then etching it.

In addition, a plurality of heat releasing grooves may be formed on a surface of the metal substrate opposite to the photonic device so as to improve heat releasing efficiency.

Another embodiment of the present invention provides a method of manufacturing a metal-based photonic device package module, including preparing a plate-shaped metal substrate, forming a metal oxide layer having a mounting cavity by performing selective anodic oxidation on the metal substrate to a predetermined depth, forming a reflecting plane by plating an inner surface of the mounting cavity of the metal oxide layer, and mounting a photonic device in the mounting cavity of the metal oxide layer on the metal substrate.

Yet another embodiment of the present invention provides a method of manufacturing a metal-based photonic device package module, including preparing a plate-shaped metal substrate, forming a metal oxide layer by performing anodic oxidation on the metal substrate to a predetermined depth, forming a mounting cavity by etching a portion of the metal oxide layer, forming a reflecting plane on an inner surface of the metal oxide layer, and mounting a photonic device in the mounting cavity of the metal oxide layer on the metal substrate.

Advantageous Effects

According to a metal-based photonic device package module and a manufacturing method thereof of the present invention, since a thin plate-shaped metal substrate is used, it is possible to effectively release heat generated from the photonic device and to implement a thin package.

According to a metal-based photonic device package module of the present invention, since the metal substrate is constructed with an aluminum wafer or the like, the metal-based photonic device package module is formed to be flexible so that the package module can be deformed or bent in an arbitrary shape if needed, even after packaging.

According to a metal-based photonic device package module and a metal-based display apparatus of the present invention, since the wafer-level packaging is available, it is possible to implement a very thin package to implement a high degree of integration. In addition, since an array package of photonic devices such as light-emitting diodes (LEDs) can be easily obtained, it is possible to easily implement a surface-type light source.

According to a metal-based photonic device package module, a manufacturing thereof, and a metal-based display apparatus of the present invention, driver chips and circuits can also be packaged, and subsequent processes can be carried out in a multi-layered manner.

According to a metal-based photonic device package module of the present invention, since a metal oxide layer is formed, a possibility of occurrence of short-circuit to a bottom electrode can be substantially reduced.

BEST MODE FOR CARRYING OUT THE INVENTION

Hereinafter, exemplary embodiments of a metal-based photonic device package module and a manufacturing method thereof according to the present invention are described in detail with reference to the accompanying drawings. In the drawings, the same reference numerals denote the same elements.

The exemplary embodiments of the present invention can be modified in various manners, and the present invent is not limited to the below-described exemplary embodiments.

The exemplary embodiments of the present invention are provided so that the ordinarily skilled in the related art can understood the present invention. In the drawings, shapes of elements may be exemplified and exaggerated for the convenience of description.

Figure 1:
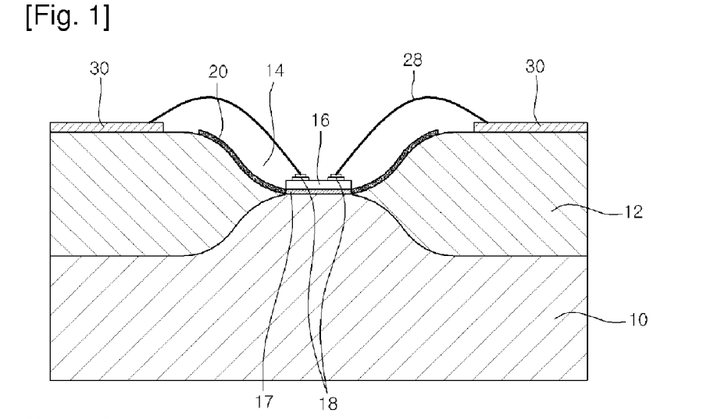
FIG. 1 is a partially enlarged cross-sectional view illustrating a first embodiment of a metal-based photonic device package module according to the present invention.
Figure 2:
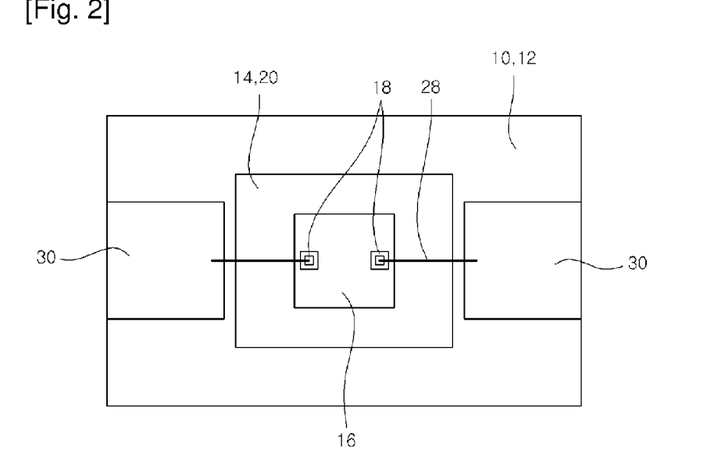
FIG. 2 is a partially enlarged top plan view illustrating the first embodiment of the metal-based photonic device package module according to the present invention.

In a first embodiment of the metal-based photonic device package module according to the present invention, as shown in FIGS. 1 and 2, a metal oxide layer 12 is formed on a metal substrate 10 through selective anodic oxidation.

The metal substrate 10 is formed in the shape of a plate by using a material having excellent thermal conductivity in comparison to a synthetic resin or a ceramic. For example, the metal substrate 10 is formed in the shape of a plate having a thickness of about 0.1 to 5 mm, and preferably in the shape of a thin plate having a thickness of about 0.15 to 1.0 mm.

As a material for forming the metal substrate 10, aluminum, titanium, or the like can be used.

In a case where the metal substrate 10 is made of aluminum, an aluminum oxide layer is formed as the metal oxide layer 12 through the anodic oxidation.

The metal oxide layer 12 has a mounting cavity 14 that is formed by performing the selective anodic oxidation on the metal substrate 10.

For example, an anti-oxidation mask pattern is formed on a portion of the metal substrate 10 where the mounting cavity 14 is to be formed, and the anodic oxidation is performed on the metal substrate 10 so that the metal oxide layer 12 is formed. Namely, while the metal oxide layer 12 is formed through the anodic oxidation, the thickness thereof is increased, and a portion where the metal oxide layer 12 is not sufficiently formed has a relatively concave shape so that the portion becomes the mounting cavity 14.

A photonic device 16 is mounted in the mounting cavity 14. As the photonic device 16, a light-receiving device or a light-emitting device may be used. As an example of the light-emitting device, an LED device is used.

The metal oxide layer 12 is formed to have a thickness corresponding to a height of the photonic device 16 mounted in the mounting cavity 14. Preferably, the thickness of the metal oxide layer 12 is about 0.25 to 5 times the height of the photonic device 16. In this case, the total thickness of the package where the photonic device 16 is mounted can be minimized, and a height of a reflecting plane 20 formed in an inner surface of the mounting cavity 14 can be increased so that light emitting efficiency can be improved. The metal oxide layer 12 can be divided into a portion that is formed to expand toward a surface of the metal substrate 10 and a portion that is formed to penetrate into an inner portion of the metal substrate 10. The height of the metal oxide layer 12 is the sum of heights of the two portions.

For example, when the mounting cavity 14 is formed on the metal oxide layer 12 and the photonic device 16 is mounted in the mounting cavity 14, it is preferable that the thickness of the metal oxide layer 12 is suitably defined so that a lower end portion of the photonic device 16 or the entire portion of the photonic device 16 can be inserted into the mounting cavity 14. In other words, it is preferable that the height of the metal oxide layer 12 is suitably defined so as to minimize a height of a portion of the photonic device 16 protruding from the surface of the metal oxide layer 12 in the state that the photonic device 16 is mounted in the mounting cavity 14.

As shown in FIG. 1, the mounting of the photonic device 16 is performed by adhering the photonic device 16 to the metal substrate 10 with an adhesive 17.

Figure 3:
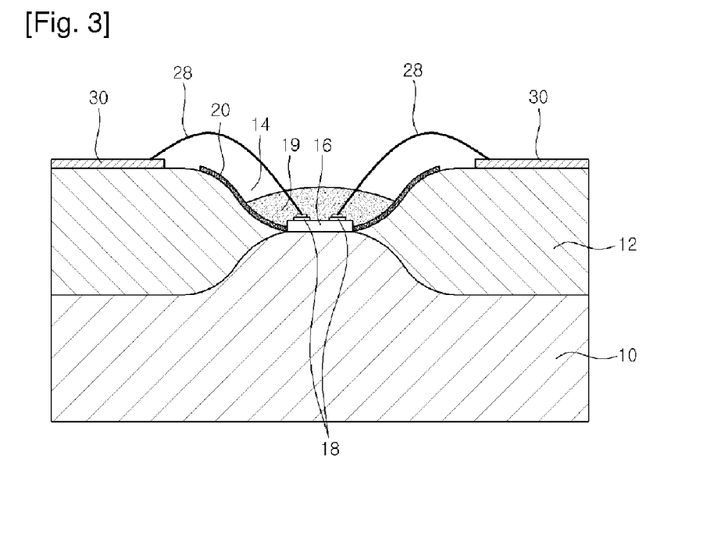
FIG. 3 is a partially enlarged cross-sectional view illustrating a molding-processed state of a photonic device in the first embodiment of the metal-based photonic device package module according to the present invention.

Alternatively, as shown in FIG. 3, the mounting of the photonic device 16 may be performed by molding and securing a top space of the photonic device 16 with a molding material 19.

In the case of molding and securing the photonic device 16 with the molding material 19, if the thickness of the molding material 19 covering the top surface of the photonic device 16 is adjusted, an effect of a lens can be obtained. In an example, by coating the molding material 19, a central portion of the photonic device 16 may be formed to be thick, and the thickness thereof may be decreased toward the edge. In this case, an effect of a convex lens can be obtained. In another example, by coating the molding material 19, the central portion thereof may be formed to be thin, and the thickness thereof may be increased toward the edge. In this case, an effect of a concave lens can be obtained.

In addition, a wavelength-varying material such as a dye may be added to the molding material 19. In this case, in addition to the effect of light emitting of the photonic device 16, an additional effect can be obtained.

If the thickness of the metal oxide layer 12 is too much smaller than that of the photonic device 16, a portion of the mounting cavity 14 on the metal substrate 10 can be etched so that the mounting cavity 14 is formed to be deeper. Namely, by etching a portion of the mounting cavity 14 on the metal substrate 10 where the metal oxide layer 12 is not formed, the bottom level of the mounting cavity 14 can be formed to be deeper.

In this manner, when the mounting cavity 14 is formed to be deeper by etching the metal substrate 10, although the metal oxide layer 12 is formed to be thin, the photonic device 16 can be mounted so that the surface of the photonic device 16 is not higher than the surface of the metal oxide layer 12.

An electrode terminal 18 made of a conductive material such as copper (Cu) or gold (Au) is formed on an upper surface of the photonic device 16.

The aforementioned reflecting plane 20 is formed in the inner surface of the mounting cavity 14.

More specifically, the reflecting plane 20 is formed by plating, depositing, or coating a material selected from a metal such as gold, silver, copper, platinum, and palladium, or an alloy thereof, on the inner surface of the mounting cavity 14.

Due to the reflecting plane 20, light beams propagating toward a side surface among light beams emitted from the photonic device 16 can be reflected toward a front surface, so that light emitting efficiency can be maximized.

Lead lines 28 are connected between the electro terminals 18 and passive circuits or connection wire lines 30 formed on the metal oxide layer 12. As the lead line 28, a conductive wire or the like is used.

In FIGS. 1 and 2, all the electrode terminals 18 are formed on the upper surface of the photonic device 16, and the electrode terminals 18 are connected to the passive circuits or the connection wire lines 30 through the lead lines 28.

Since the reflecting plane 20 is made of a conductive metal, the reflecting plane 20 needs to be formed to be separated by a predetermined distance from the passive circuit or the connection wire line 30 in order to prevent a short-circuit.

Figure 4:
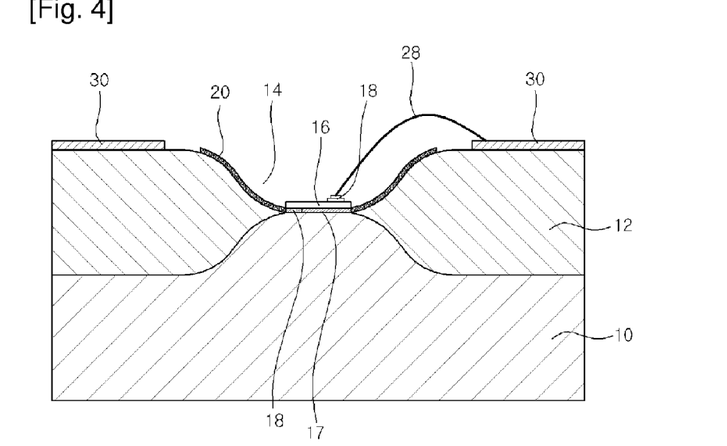
FIG. 4 is a partially enlarged cross-sectional view illustrating a second embodiment of the metal-based photonic device package module according to the present invention.

In a second embodiment of the metal-based photonic device package module according to the present invention, as shown in FIG. 4, the electrode terminals 18 are separately formed on the two surfaces of the photonic device 16.

In the second embodiment, the metal substrate 10 is used as the one electrode, and the electrode terminal 18 formed on the upper surface of the photonic device 16 is connected to the passive circuit or the connection wire line 30 through the lead line 28.

The photonic device 16 is adhered on the metal substrate 10 with a conductive adhesive 17, the electrode terminal 18 formed on the lower surface of the photonic device 16 is electrically connected to the metal substrate 10 through the conductive adhesive 17, and the metal substrate 10 is used as the one electrode.

In the second embodiment, in order to prevent a short-circuit caused by the reflecting plane 20, it is preferable that the reflecting plane 20 is formed to be separated by a predetermined distance from the passive circuits or the connection wire lines 30.

In the second embodiment, other constructions are the same as those of the first embodiment, and thus detailed description thereof is omitted.

Figure 5:
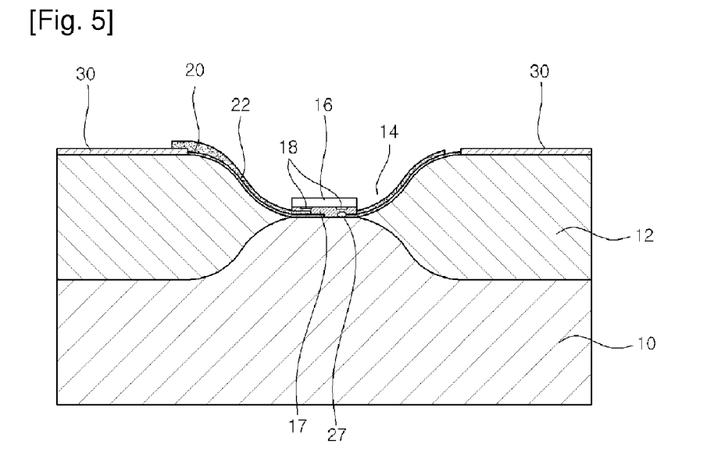
FIG. 5 is a partially enlarged cross-sectional view illustrating a third embodiment of the metal-based photonic device package module according to the present invention.

In a third embodiment of the metal-based photonic device package module according to the present invention, as shown in FIG. 5, all the electrode terminals 18 are formed on the lower surface of the photonic device 16, and a dielectric layer 22 for insulation is formed by applying a dielectric material before the formation of the reflecting plane 20.

In the third embodiment, the one electrode terminal 18 is connected to a passive circuit or a connection wire line 30 through the reflecting plane 20 made of a conductive metal, and the other electrode terminal 18 is connected to a passive circuit or a connection wire line 30 by using the metal substrate 10 as the other electrode.

The other electrode terminal 18 is electrically connected to the metal substrate 10 through a contact hole 27 filled with a conductor, and the metal substrate 10 is used as the other electrode.

In the third embodiment, since the electrode terminal 18 is connected to the passive circuit or the connection wire line 30 through the reflecting plane 20, in order to prevent a short-circuit between the reflecting plane 20 and the other electrode terminal 18 and between the reflecting plane 20 and the metal substrate 10, dielectric layers 22 are formed between the reflecting plane 20 and the metal oxide layer 12 and between the reflecting plane 20 and the metal substrate 10. More specifically, the dielectric material is applied on the inner surface of the mounting cavity 14 to form the dielectric layer 22, and subsequently, the reflecting plane 20 is formed on the dielectric layer 22.

In the dielectric layer 22, the aforementioned contact hole 27 filled with a conductor is formed so as to electrically connect the other electrode terminal 18 to the metal substrate 10.

In the third embodiment, other constructions are the same as those of the first embodiment, and thus detailed description thereof is omitted.

Figure 6:
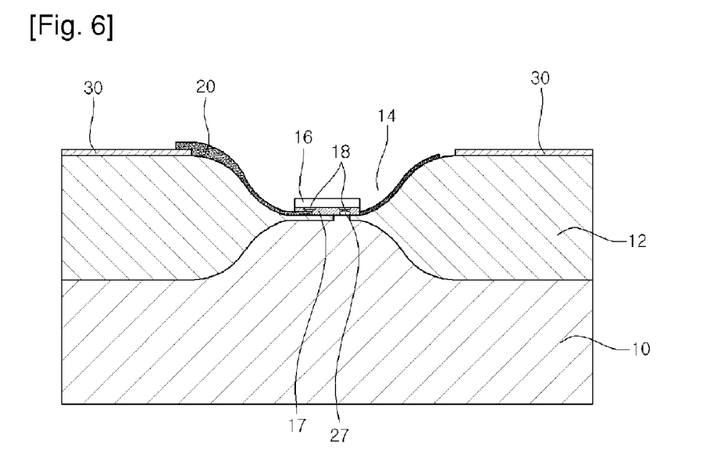
FIG. 6 is a partially enlarged cross-sectional view illustrating a fourth embodiment of the metal-based photonic device package module according to the present invention.

In a fourth embodiment of the metal-based photonic device package module according to the present invention, as shown in FIG. 6, all the electrode terminals 18 are formed on the lower surface of the photonic device 16, and for the purpose of insulation, the metal oxide layer 12 is formed to extend to the bottom surface of the mounting cavity 14.

In the fourth embodiment, the one electrode terminal 18 is connected to a passive circuit or a connection wire line 30 through the reflecting plane 20 made of a conductive metal, and the other electrode terminal 18 is connected to a passive circuit or a connection wire line 30 by using the metal substrate 10 as the other electrode.

The other electrode terminal 18 is electrically connected to the metal substrate 10 through a contact hole 27 filled with a conductor, and the metal substrate 10 is used as the other electrode.

In the fourth embodiment, since the electrode terminal 18 is connected to the passive circuit or the connection wire line 30 through the reflecting plane 20, in order to prevent a short-circuit between the reflecting plane 20 and the other electrode terminal 18 and between the reflecting plane 20 and the metal substrate 10, the metal oxide layer 12 is formed to the bottom surface of the mounting cavity 14 (a surface on which the photonic device 16 is mounted).

It is preferable that the anodic oxidation is controlled so that the metal oxide layer 12 formed on the bottom surface of the mounting cavity 14 becomes thin. In addition, a portion where the electrode terminal 18 is connected to the metal substrate 10 is subjected to selective anodic oxidation or anodic oxidation and etching, so that the metal oxide layer 12 does not exist in the portion.

For example, in the metal oxide layer 12 formed on the bottom surface of the mounting cavity 14, the contact hole 27 filled with a conductor is formed so as to electrically connect the other electrode terminal 18 to the metal substrate 10.

In the fourth embodiment, other constructions are the same as those of the first embodiment, and thus detailed description thereof is omitted.

Figure 7:
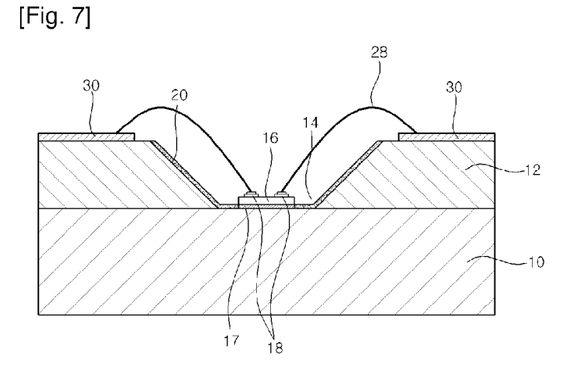
FIG. 7 is a partially enlarged cross-sectional view illustrating a fifth embodiment of the metal-based photonic device package module according to the present invention.

In a fifth embodiment of the metal-based photonic device package module according to the present invention, as shown in FIG. 7, the metal oxide layer 12 is formed on the front surface of the metal substrate 10, and a portion of the metal oxide layer 12 where the photonic device 16 is to be mounted is subjected to etching or drilling to a predetermined depth to form the mounting cavity 14.

For example, the metal oxide layer 12 is formed by performing the anodic oxidation on one entire surface (upper surface) of the metal substrate 10. Next, a mask pattern is formed on a portion of the metal oxide layer 12 except for the portion where the mounting cavity 14 is to be formed, and the etching is performed on the portion of the metal oxide layer 12 where the mounting cavity 14 is to be formed, so that the mounting cavity 14 is formed. Alternatively, instead of formation of the mask pattern, the mounting cavity 14 may be formed on the metal oxide layer 12 by performing mechanical or laser drilling to a predetermined depth.

In the fifth embodiment, other constructions are the same as those of the first to fourth embodiments, and thus detailed description thereof is omitted.

Now, methods of manufacturing a metal-based photonic device package module having the aforementioned constructions are described.

Figure 8:
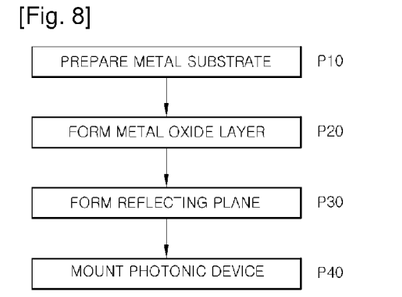
FIG. 8 is a block diagram illustrating an embodiment of a method of manufacturing a metal-based photonic device package module according to the present invention.
Figure 9:
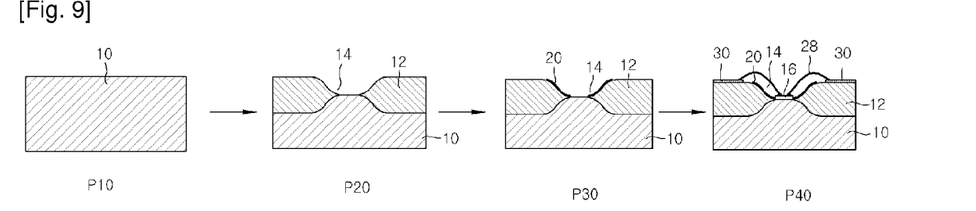
FIG. 9 is a flowchart illustrating processes in the embodiment of the method of manufacturing a metal-based photonic device package module according to the present invention.

A method of manufacturing a metal-based photonic device package module according to an embodiment of the present invention, as shown in FIGS. 8 and 9, includes a step P10 of preparing a metal substrate 10 in the shape of a plate, a step P20 of forming a metal oxide layer 12 on the metal substrate 10, a step P30 of forming a reflecting plane 20 on an inner surface of a mounting cavity 14 of the metal oxide layer 12, and a step of mounting a photonic device 16 in the mounting cavity 14 of the metal oxide layer 12 on the metal substrate 10.

The metal substrate 10 is formed in the shape of a plate by using a material having excellent thermal conductivity that is higher than that of a synthetic resin or a ceramic.

For example, as a material for forming the metal substrate 10, aluminum, titanium, or the like can be used.

The metal substrate 10 is formed in the shape of a plate having a thickness of about 0.1 to 5 mm, and preferably in the shape of a thin plate having a thickness of about 0.15 to 1.0 mm.

In a case where the metal substrate 10 is made of aluminum, an aluminum oxide layer is formed as the metal oxide layer 12 through the anodic oxidation.

In the step P20 of forming the metal oxide layer 12, the mounting cavity 14 where the photonic device 16 is to be mounted is formed.

Figure 10:
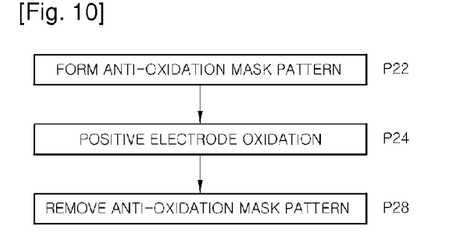
FIG. 10 is a block diagram illustrating an example of a metal oxide layer forming step in the embodiment of the method of manufacturing a metal-based photonic device package module according to the present invention.
Figure 11:
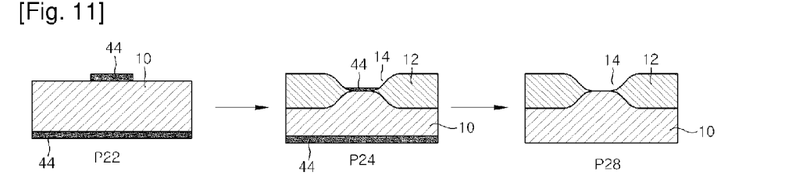
FIG. 11 is a flowchart illustrating an example of a metal oxide layer forming step in the embodiment of the method of manufacturing a metal-based photonic device package module according to the present invention.

The step P20 of forming the metal oxide layer 12, as shown in FIGS. 10 and 11, includes a step P22 of forming an anti-oxidation mask pattern 44 on a portion of the metal oxide layer 12 that is not subjected to the anodic oxidation, a step P24 of forming the metal oxide layer 12 by performing the selective anodic oxidation on the metal substrate 10 to a predetermined depth, and a step P28 of removing the anti-oxidation mask pattern 44.

The metal oxide layer 12 is formed to have a thickness corresponding to a height of the photonic device 16 mounted in the mounting cavity 14. More specifically, the thickness of the metal oxide layer 12 is about 0.25 to 5 times the height of the photonic device 16.

The anti-oxidation mask pattern 44 is formed on the entire lower surface of the metal substrate 10 and the portion of the upper surface of the metal substrate 10 where the mounting cavity 14 is to be formed (the portion where the photonic device 16 is to be mounted).

The shape of the mounting cavity 14 is formed to correspond to the shape of the anti-oxidation mask pattern 44 formed on the upper surface of the metal substrate 10. More specifically, the shape of the mounting cavity 14 may be formed to be a circle or an arbitrary polygon.

Due to the anti-oxidation mask pattern 44 formed on the lower surface of the metal substrate 10, during the anodic oxidation, only the upper surface of the metal substrate 10 is oxidized, so that the metal oxide layer 12 is formed on only the upper surface of the metal substrate 10.

Alternatively, in a case where the lower surface of the metal substrate 10 may be protected so as to not be oxidized by using an apparatus or a tool, the anti-oxidation mask pattern 44 is not formed on the lower surface of the metal substrate 10. In other words, since the anti-oxidation mask pattern 44 is used so as to prevent the anodic oxidation of the lower surface of the metal substrate 10, if the anodic oxidation can be prevented by using a suitable method, the anti-oxidation mask pattern 44 for preventing the oxidation of the lower surface of the metal substrate 10 is not needed.

The formation of the anti-oxidation mask pattern 44 can be performed by using a well-known lithography process or pattern forming process, and thus detailed description thereof is omitted.

It is preferable to use a material that is relatively vulnerable to the anodic oxidation as the material for forming the anti-oxidation mask pattern 44. For example, silicon nitride or the like may be preferably used.

As shown in FIG. 11, during the anodic oxidation of the metal substrate 10, volume expansion occurs in the oxidized portion, so that the mounting cavity 14 is formed.

In case of the selective anodic oxidation using the anti-oxidation mask pattern 44, as shown in FIG. 11, a slanted surface (or a curved surface) having the shape of a bird's beak is formed along an edge of the anti-oxidation mask pattern 44.

The anti-oxidation mask pattern 44 is removed by using a wet etching method or a dry etching method.

Figure 12:
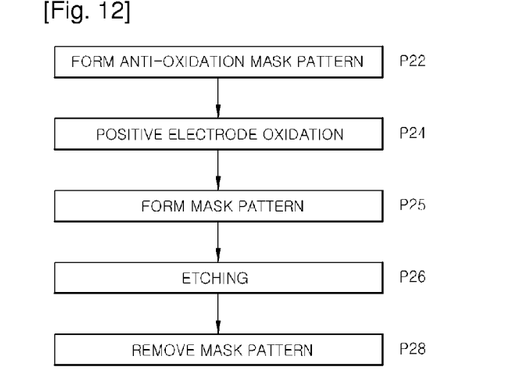
FIG. 12 is a block diagram illustrating another example of the metal oxide layer forming step in the embodiment of the method of manufacturing a metal-based photonic device package module according to the present invention.
Figure 13:
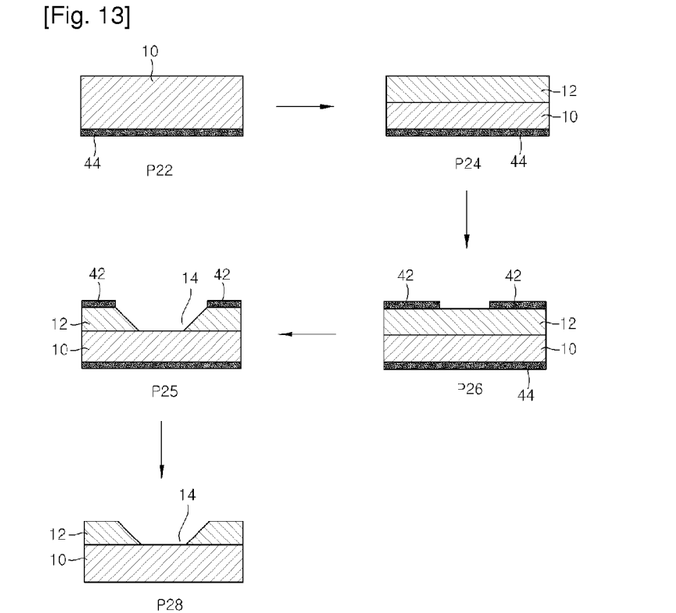
FIG. 13 is a flowchart illustrating another example of the metal oxide layer forming step in the embodiment of the method of manufacturing a metal-based photonic device package module according to the present invention.

As an alternative method, the step P20 of forming the metal oxide layer 12, as shown in FIGS. 12 and 13, includes a step P22 of forming the anti-oxidation mask pattern 44 on the one surface (lower surface) of the metal substrate 10, a step P24 of forming the metal oxide layer 12 by performing the anodic oxidation on the other surface (upper surface) of the metal substrate 10 to a predetermined depth, a step P25 of forming a mask pattern 42 on the metal oxide layer 12, a step P26 of performing etching on the metal oxide layer 12, and a step P28 of removing the anti-oxidation mask pattern 44 and the mask pattern 42.

The mask pattern 42 is formed on a portion of the metal oxide layer 12 except for the portion where the mounting cavity 14 is to be formed (the portion where the photonic device 16 is to be formed).

The formation of the mask pattern 42 can be performed by using a well-known lithography process or pattern forming process, and thus detailed description thereof is omitted.

The shape of the mounting cavity 14 is formed to correspond to the shape of the portion where the mask pattern 42 is not formed. More specifically, the shape of the mounting cavity 14 may be formed to be a circle or an arbitrary polygon.

It is preferable that a material that is relatively vulnerable to the etching performed on the metal oxide layer 12 is used as the material for forming the mask pattern 42. For example, a photoresist or the like may be preferably used.

The metal oxide layer 12 is etched by using a wet etching method or the like. The etching is performed so that the etched surface of the metal oxide layer 12 becomes a slanted surface or a vertical surface.

The anti-oxidation mask pattern 44 and the mask pattern 42 are removed by using a wet etching method or a dry etching method.

Alternatively, instead of formation of the mask pattern 42, the mounting cavity 14 may be formed on the metal oxide layer 12 by performing mechanical or laser drilling to a predetermined depth.

The reflecting plane 20 may be formed by directly plating, depositing, or coating a metal such as gold, silver, copper, platinum, and palladium, or an alloy thereof, on the inner surface of the mounting cavity 14 on the metal oxide layer 12.

Alternatively, the reflecting plane 20 may be formed by coating a dielectric material on the inner surface of the metal oxide layer 12 to form a dielectric layer 22 and plating or depositing a metal such as gold, silver, copper, platinum, and palladium, or an alloy thereof.

The photonic device 16 may be mounted by using an adhesive. Alternatively, the photonic device 16 may be mounted by disposing the photonic device 16 on the mounting cavity 14 and molding a top space of the photonic device 16.

A lead line 28 or the like is used to connect the electrode terminal 18 of the photonic device 16 to a passive circuit or a connection wire line 30 formed on the metal oxide layer 12.

In addition, the electrode terminal 18 may be connected by using the metal substrate 10 as the other electrode.

The connection of the electrode terminal 18 of the photonic device 16 can be performed by using various methods described in the first to fourth embodiments of the metal-based photonic device package module according to the present invention.

Now, various embodiments of a metal-based display apparatus according to the present invention, implemented by using the first to fifth embodiments of the metal-based photonic device package module according to the present invention, are described with reference to FIGS. 14 to 24.

Figure 14:
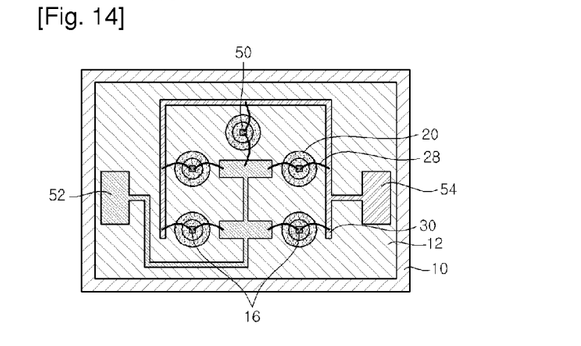
FIG. 14 is a partially enlarged top plan view illustrating a first embodiment of a metal-based display apparatus according to the present invention.

In a first embodiment of the metal-based display apparatus according to the present invention, as shown in FIG. 14, a plurality of photonic devices 16 are disposed and mounted in series or in parallel on a metal substrate 10, and a ground electrode 52, a source electrode 54, and an electrostatic discharge (ESD) protection device 50 are connected to each of the photonic devices 16 so as to form a circuit on the metal substrate 10.

As the electrostatic discharge protection device 50, a zener diode, an ESD protection varistor, or the like may be used.

Figure 16:
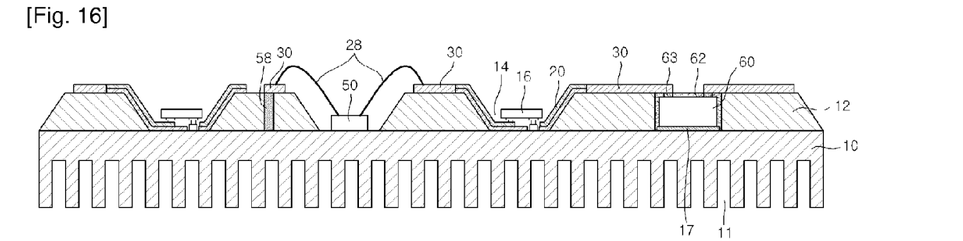
FIG. 16 is a partially enlarged top plan view illustrating a third embodiment of a metal-based display apparatus according to the present invention.

As shown in FIG. 16, the photonic devices 16 and the electrostatic discharge protection devices 50 may be disposed and mounted in a plurality of mounting cavities 14 formed on the metal substrate 10.

Figure 15:
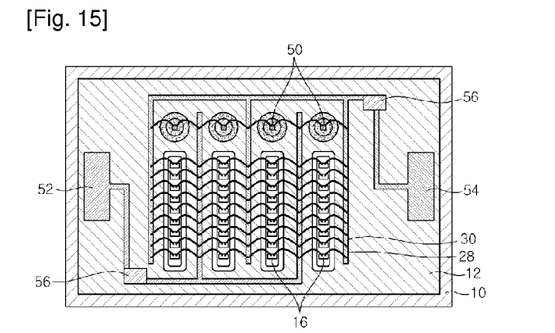
FIG. 15 is a partially enlarged top plan view illustrating a second embodiment of a metal-based display apparatus according to the present invention.

In a second embodiment of the metal-based display apparatus according to the present invention, as shown in FIG. 15, the plurality of photonic devices 16 are disposed in a row with a predetermined interval therebetween, and the plurality of photonic devices 16 are electrically connected in parallel to each other to form a photonic device column. Next, a plurality of the photonic device columns are electrically connected to each other in parallel, so that a surface-type light source can be implemented.

In the second embodiment, the plurality of photonic devices 16, the plurality of electrostatic discharge protection devices 50, and the like are mounted in the mounting cavities 14, and the ground electrode 52 and the source electrode 54 are connected thereto.

In addition, a voltage drop/rectifying circuit 56 may be connected to the ground electrode 52 and the source electrode 54.

Due to the voltage drop/rectifying circuit 56 connected to the ground electrode 52 and the source electrode 54, even in a case where AC voltage is directly applied to the source electrode 54, the same effect as that of DC voltage can be obtained. In the case of applying the DC voltage to the source electrode 54, the voltage drop/rectifying circuit 56 is not needed.

Alternatively, instead of disposing the electrostatic discharge protection devices 50, an electrostatic discharge protection material may be coated on a surface of a package so as to obtain a function of ESD protection. As the ESD protection material, a material capable of withstanding less than a predetermined voltage and recovering in a predetermined time after breakdown is preferred.

In a third embodiment of the metal-based display apparatus according to the present invention, as shown in FIG. 16, the photonic devices 16, a driver chip 60, and the electrostatic discharge protection devices 50 are mounted on the metal substrate 10.

Figure 17:
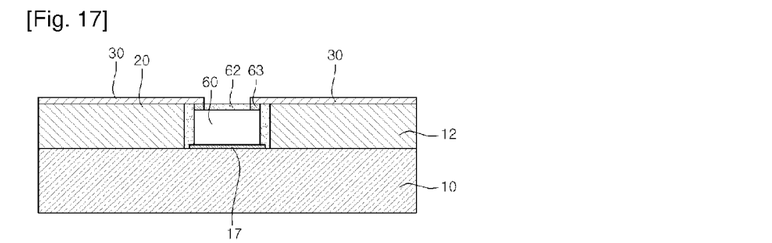
FIG. 17 is a partially enlarged top plan view illustrating a first example of mounting a driver chip in the third embodiment of a metal-based display apparatus according to the present invention.

As shown in FIG. 17, the driver chip 60 is mounted in the mounting cavity 14 formed on the metal oxide layer 12 by using an adhesive 17.

In addition, an organic insulating layer 62 is formed to cover the driver chip 60 and fill the remaining space of the mounting cavity 14 by applying an organic material such as benzocyclobutene (BCB), polyimide, and the like.

The driver chip 60 is electrically connected to a connection wire line 30 or a circuit through a contact hole 63 formed in the organic insulating layer 62.

The organic insulating layer 62 may not be formed on the upper surface of the driver chip 60. Alternatively, the organic insulating layer 62 may be formed on the upper surface of the driver chip 60 except for the portion where the contact hole 63 is to be formed or the portion where the electrode terminal is to be formed.

The side surface of the mounting cavity 14 where the driver chip 60 is to be mounted may be formed as a vertical surface or a slanted surface.

Figure 18:
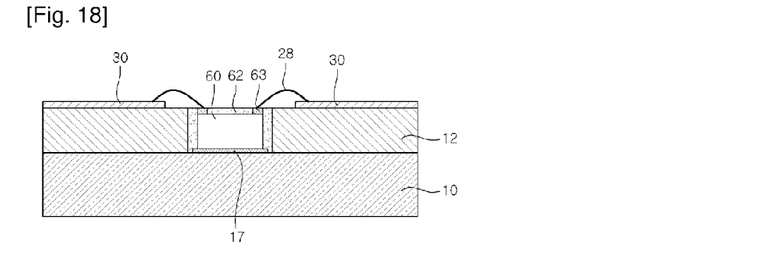
FIG. 18 is a partially enlarged top plan view illustrating a second example of mounting a driver chip in the third embodiment of a metal-based display apparatus according to the present invention.

In addition, as shown in FIG. 18, the driver chip 60 may be electrically connected to a connection wire line 30 or a circuit through a wire-shaped lead line 28.

Figure 19:
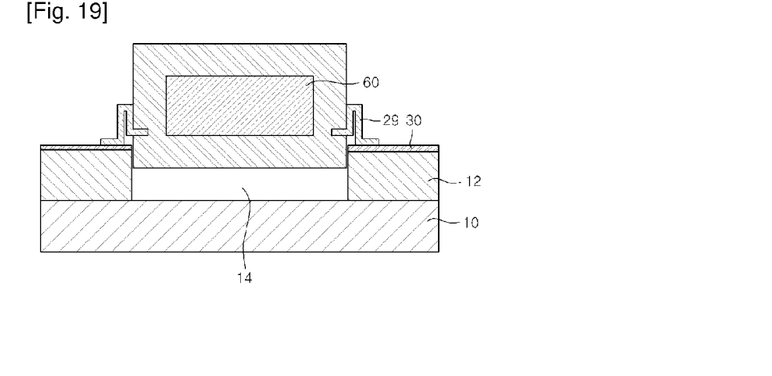
FIG. 19 is a partially enlarged top plan view illustrating a third example of mounting a driver chip in the third embodiment of a metal-based display apparatus according to the present invention.

Referring to FIG. 19, the driver chip 60 in a packaged state is mounted in the mounting cavity 14. The driver chip 60 is electrically connected to a connection wire line 30 or a circuit through a lead line 29.

Figure 20:
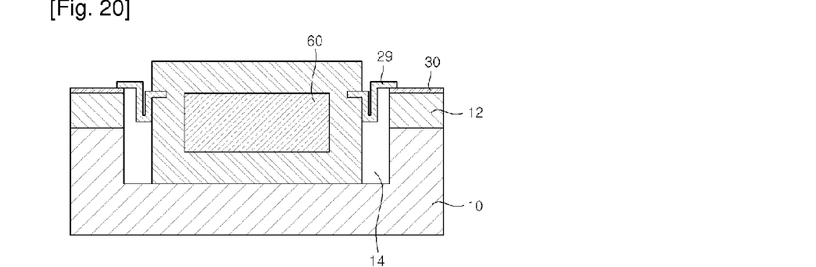
FIG. 20 is a partially enlarged top plan view illustrating a fourth example of mounting a driver chip in the third embodiment of a metal-based display apparatus according to the present invention.

Referring to FIG. 20, the driver chip 60 in a packaged state is mounted in the mounting cavity, and the mounting cavity 14 is deeply etched into the metal substrate 10. Due to the mounting structure, the height of the driver chip 60 protruding from the surface of the metal oxide layer 12 can be minimized.

Figure 21:
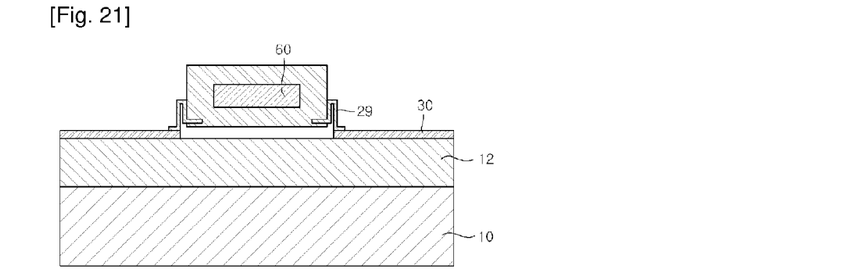
FIG. 21 is a partially enlarged top plan view illustrating a fifth example of mounting a driver chip in the third embodiment of a metal-based display apparatus according to the present invention.

Referring to FIG. 21, the driver chip 6 in a packaged state is mounted in a surface mounting manner on the metal oxide layer 12, not in the mounting cavity 14.

As shown in FIG. 16, the electrostatic discharge protection device 50 is mounted in the mounting cavity 14 formed on the metal oxide layer 12.

It is preferable that the electrostatic discharge protection device 50 is mounted so that the top portion thereof is located at a position deeper than the surface of the metal oxide layer 12 so as to not receive light from the photonic device 16. If the electrostatic discharge protection device 50 receives light, current flows due to the photoelectric effect, so that the electrostatic discharge protection effect cannot be effectively obtained.

Although not shown in the figures, in a case of the electrostatic discharge protection device 50 similar to the driver chip 60, the organic insulating layer 62 may be formed on the upper surface of the electrostatic discharge protection device 50 and the remaining space of the mounting cavity 14.

Alternatively, the organic insulating layer 62 may not be formed on the upper surface of the electrostatic discharge protection device 50. In addition, in a case where the electrode terminal 18 is formed on the upper surface of the electrostatic discharge protection device 50, the organic insulating layer 62 may be formed except for the portion where the electrode terminal 18 is formed.

Since the reflecting plane 20 is not used in the inner surface of the mounting cavity 14 where electrostatic discharge protection device 50 is mounted, it is preferable that the reflecting plane 20 is not formed thereon. In the case of using the electrostatic discharge protection device 50, since the function of receiving light may not be effectively obtained, it is preferable that the reflecting plane 20 is not formed.

The side surface of the mounting cavity 14 where the electrostatic discharge protection device 50 is to be mounted may be formed as a vertical surface.

Similarly to the cases shown in FIG. 1 and FIGS. 4 to 6, in the case of the electrostatic discharge protection device 50, the electrode can be connected by using the aforementioned construction of connection of the electrode terminal 18 of the photonic device 16, and thus detailed description thereof is omitted.

Alternatively, as shown in FIG. 16, in the case of the electrostatic discharge protection device 50, the one electrode may be electrically connected to the metal substrate 10 through a contact hole 58 that is formed by filling a via hole penetrating the metal oxide layer 12 with a conductor, and the metal substrate 10 may be used as the other electrode.

In addition, as shown in FIG. 16, heat releasing grooves 11 for increasing a surface area to improve heat releasing efficiency may be formed on the lower surface of the metal substrate 10. The heat releasing grooves 11 may be formed by using an etching method or the like.

Figure 25:
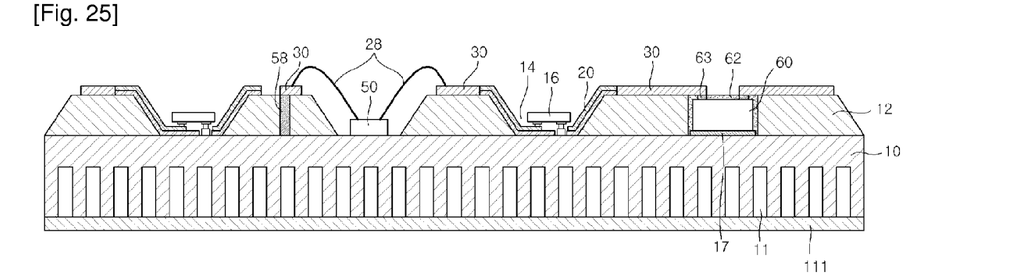
FIG. 25 is a partially enlarged top plan view illustrating a seventh embodiment of a metal-based display apparatus according to the present invention.

In addition, as shown in FIG. 25, a metal plate 111 may be attached under the heat releasing grooves 11 so that a coolant can be directed through the heat releasing grooves 11 as a cooling structure. In this case, the heat releasing grooves 11 are used to constitute a coolant path.

Figure 22:
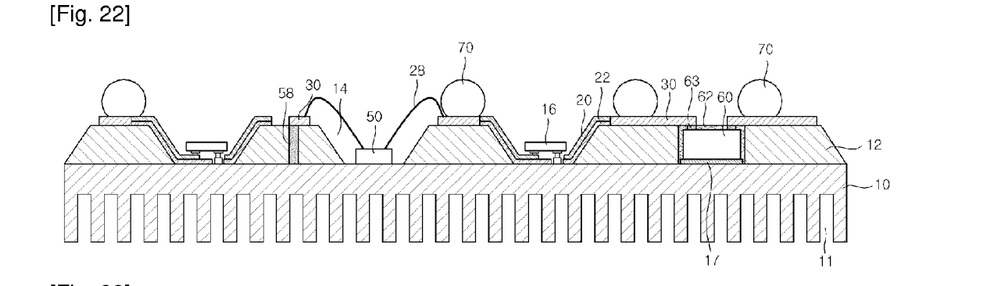
FIG. 22 is a partially enlarged top plan view illustrating a fourth embodiment of a metal-based display apparatus according to the present invention.

In a fourth embodiment of the metal-based display apparatus according to the present invention, as shown in FIG. 22, a ball grid array (BGA) structure or a land grid array (LGA) structure is implemented. In the structure, flip-chip solder balls 70 are disposed on the connection wire line 30 and the metal oxide layer 12, so that the connection wire line 30 and the other circuit can be easily connected to each other.

Figure 23:
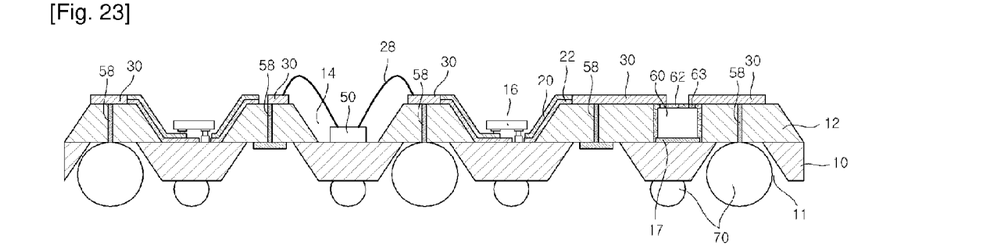
FIG. 23 is a partially enlarged top plan view illustrating a fifth embodiment of a metal-based display apparatus according to the present invention.

In a fifth embodiment of the metal-based display apparatus according to the present invention, as shown in FIG. 23, the BGA structure or the LGA structure is implemented by disposing the flip-chip solder balls 70 on the lower surface of the metal substrate 10 and in the inner portions of the heat releasing grooves 11 that are formed by etching the lower surface of the metal substrate 10 to expose the metal oxide layer 12.

The side surfaces of the heat releasing grooves 11 may be formed as a slanted surface in order to stably dispose the flip-chip solder balls 70 in the inner portions of the heat releasing grooves 11.

The sizes of the flip-chip solder balls 70 and the depths of the heat releasing grooves 11 are preferably defined so that the heights of the flip-chip solder balls 70 disposed on the heat releasing grooves 11 protruding from the lower surface of the metal substrate 10 are equal to the heights of the flip-chip solder balls 70 directly disposed on the lower surface of the metal substrate 10.

In this case, the flip-chip solder balls 70 may not be attached on the contact holes 58 in the heat releasing grooves 11, and the lower portions of the contact holes 58 may be electrically connected.

Figure 24:
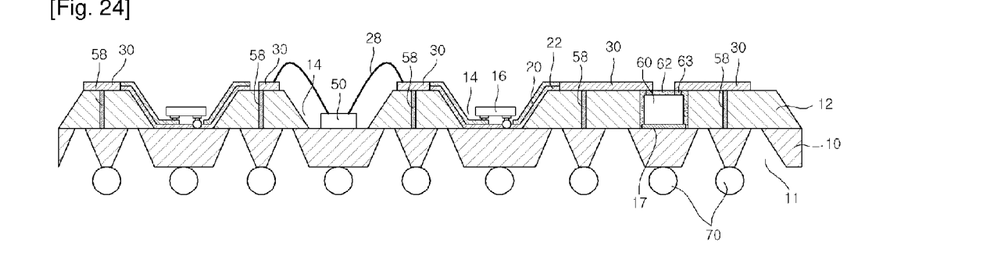
FIG. 24 is a partially enlarged top plan view illustrating a sixth embodiment of a metal-based display apparatus according to the present invention.

In a sixth embodiment of the metal-based display apparatus according to the present invention, as shown in FIG. 24, the BGA structure or the LGA structure is implemented by disposing the flip-chip solder balls 70 on only the lower surface of the metal substrate 10.

In the fifth and sixth embodiments of the metal-based display apparatus according to the present invention, as shown in FIGS. 23 and 24, the contact holes 58 are formed by filling via holes penetrating the metal oxide layer 12 with a conductor so as to electrically connect the driver chips 60, the electrostatic discharge protection devices 50, and the photonic device 16 to the electrodes.

The upper portions of the contact holes 58 are connected to connection wire lines 30 or circuits.

Referring to FIG. 24, the contact holes 58 are electrically connected to the metal substrate 10, and each of the heat releasing grooves 11 is formed so as to electrically isolate the different portions of the metal substrate 10 that are connected to the two different electrodes of each device. The metal oxide layer 12 is formed to be exposed toward the lower surface so that the portion of the metal substrate 10 that is connected to the one electrode is electrically isolated from the different portion (the portion of the metal substrate 10 that is connected to the other electrode).

The constructions of the fourth to sixth embodiments of the metal-based display apparatus according to the present invention in the present invention are the same as those of the first to third embodiments except for the constructions of the flip-chip solder balls 70, and thus detailed description thereof is omitted.

Figure 26:
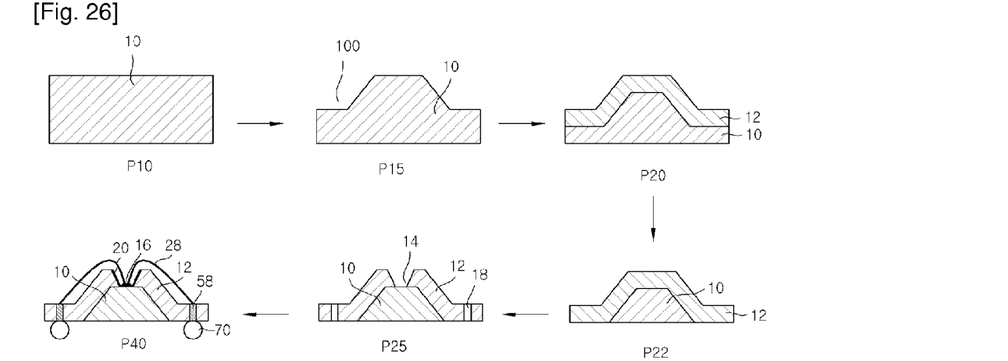
FIG. 26 is a flowchart illustrating processes in another embodiment of a method of manufacturing a metal-based photonic device package module according to the present invention.

A method of manufacturing a metal-based photonic device package module according to another embodiment of the present invention, as shown in FIG. 26, includes a step P10 of preparing a metal substrate 10 in the shape of a plate, a step P15 of forming step-shaped space portions 100 by performing an etching process or a pressing process on portions of the metal substrate 10, a step P20 of forming a metal oxide layer 12 on the metal substrate 10, a step P22 of etching the metal substrate 10 to the lower surface of the metal oxide layer 12 and planarizing the bottom surface thereof, a step P25 of forming mounting cavities 14 and contact holes 58 in the metal oxide layer 12, and a step P40 of forming a reflecting plane 20 at inner surfaces of the mounting cavities 14 and mounting photonic devices 16 in the mounting cavities 14 on the metal substrate 10.

The contact holes 58 are filled with a conductor.

In order to implement a BGA structure or an LGA structure, flip-chip solder balls 70 are disposed on the lower surfaces of the metal oxide layer 12 and the metal substrate 10.

The two electrode terminals 18 on the upper surface of the photonic device 16 are connected to the two contact holes through wire-shaped lead lines 28, respectively, and to the different flip-chip solder balls 70 through different contact holes 58.

Figure 27:
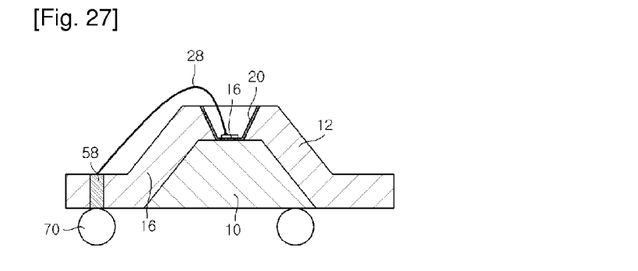
FIG. 27 is a partially enlarged cross-sectional view illustrating another example of a metal-based photonic device package module manufactured in another embodiment of a method of manufacturing a metal-based photonic device package module according to the present invention.

Alternatively, as shown in FIG. 27, in a case of the electrode terminals 18 being separately formed on the upper and lower surfaces of the photonic device 16, the electrode terminal 18 on the upper surface of the photonic device 16 may be connected to the flip-chip solder ball 70 through the wire-shaped lead line 28 and the contact hole 58, and the electrode terminal 18 on the lower surface of the photonic device 16 may be connected to the metal substrate 10 and to the flip-chip solder ball 70 disposed on the lower surface of the metal substrate 10.

The construction and processes of this embodiment of the method of manufacturing a metal-based photonic device package module according to the present invention is the same as that of the aforementioned embodiment, and thus detailed description thereof is omitted.

Although the metal-based photonic device package module, the manufacturing method thereof, and the metal-based display apparatus according to the present invention have been described in connection with the exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A metal-based photonic device package module comprising:
   a metal substrate that is formed in the shape of a plate; a metal oxide layer that is formed on the metal substrate to have a mounting cavity; a photonic device that is mounted in the mounting cavity of the metal oxide layer; and a reflecting plane that is formed in an inner surface of the mounting cavity of the metal oxide layer,
   wherein the reflecting plane is formed by using a material selected from a metal such as gold, silver, copper, platinum, and palladium, or an alloy thereof,
   wherein a dielectric layer is formed between the reflecting plane and the metal oxide layer by coating a dielectric material.

2. The metal-based photonic device package module of claim 1, wherein the reflecting plane is electrically connected to one of electrode terminals of the photonic device.

3. The metal-based photonic device package module of claim 2, wherein an electrode terminal of the photonic device is electrically connected to the metal substrate, and the metal substrate is used as another electrode terminal.

4. A metal-based display apparatus, comprising:
   a metal substrate that is formed in the shape of a plate;
   a metal oxide layer that is formed on the metal substrate to have a plurality of mounting cavities;
   photonic devices that are mounted in inner portions of some portions of the mounting cavities of the metal oxide layer;
   reflecting planes that are formed at inner surfaces of the mounting cavities of the metal oxide layer where the photonic devices are mounted by using a material selected from a metal such as gold, silver, copper, platinum, and palladium, or an alloy thereof;
   driver chips that are mounted at inner portions of other portions of the mounting cavities of the metal oxide layer; and
   connection wire lines that are formed on the metal oxide layer to be electrically connected to the photonic devices and the driver chips.

5. The metal-based display apparatus of claim 4, further comprising an electrostatic discharge protection device that is mounted at an inner portion of another portion of the mounting cavities of the metal oxide layer.

6. The metal-based display apparatus of claim 4, wherein rectifier circuits are connected to a ground electrode and a source electrode that are connected to the photonic device.

7. The metal-based display apparatus of claim 4, wherein an organic insulating layer is formed to fill spaces between the driver chips and the metal oxide layer.

8. The metal-based display apparatus of claim 4, wherein heat releasing grooves are formed by etching a lower surface of the metal substrate.

9. The metal-based display apparatus of claim 8, wherein a metal plate is attached under the heat releasing grooves so that a coolant can be directed through inner portions of the heat releasing grooves.

10. The metal-based display apparatus of claim 8, wherein electrical connection is performed on the lower portions of the metal oxide layer that are exposed by the heat releasing grooves.

11. The metal-based display apparatus of claim 8, wherein flip-chip solder balls are disposed to some or all the heat releasing grooves.

12. The metal-based display apparatus of claim 11, wherein contact holes filled with a conductor are formed to penetrate the metal oxide layer.

13. The metal-based display apparatus of claim 4, wherein flip-chip solder balls are disposed on the metal oxide layer to be connected to the connection wire lines.

14. The metal-based display apparatus of claim 4, wherein flip-chip solder balls are disposed on the lower surface of the metal substrate.

15. The metal-based display apparatus of claim 4, further comprising a dielectric layer that is formed by coating a dielectric material between the reflecting planes and the metal oxide layer.

16. The metal-based display apparatus of claim 4, wherein the metal oxide layer is formed to extend to bottom surfaces of the cavities.

17. The metal-based display apparatus of claim 4, wherein the metal substrate is used as the one electrode.

* * * * *